United States Patent
Okuyama (10) Patent No.: US 11,640,907 B2
(45) Date of Patent: *May 2, 2023

(54) SEMICONDUCTOR EPITAXIAL WAFER AND METHOD OF PRODUCING SEMICONDUCTOR EPITAXIAL WAFER, AND METHOD OF PRODUCING SOLID-STATE IMAGING DEVICE

(71) Applicant: SUMCO CORPORATION, Tokyo (JP)

(72) Inventor: Ryosuke Okuyama, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/387,001

(22) Filed: Jul. 28, 2021

(65) Prior Publication Data

US 2021/0358755 A1 Nov. 18, 2021

Related U.S. Application Data

(63) Continuation of application No. 16/621,912, filed as application No. PCT/JP2018/022448 on Jun. 12, 2018, now Pat. No. 11,107,687.

(30) Foreign Application Priority Data

Jul. 20, 2017 (JP) .............................. JP2017-141117

(51) Int. Cl.
*H01L 21/265* (2006.01)
*H01L 21/20* (2006.01)
(Continued)

(52) U.S. Cl.
CPC ............ *H01L 21/265* (2013.01); *H01L 21/20* (2013.01); *H01L 21/205* (2013.01);
(Continued)

(58) Field of Classification Search
CPC ................. H01L 21/3003; H01L 29/04; H01L 21/02658; H01L 21/20; H01L 21/02293;
(Continued)

(56) References Cited

U.S. PATENT DOCUMENTS 6,465,370 B1 10/2002 Schrems et al.
2002/0025622 A1 2/2002 Schrems et al.
(Continued)

FOREIGN PATENT DOCUMENTS

JP 2014-99472 A 5/2014
JP 2015-50425 A 3/2015
(Continued)

OTHER PUBLICATIONS

ISR for PCT/JP2018/022448, dated Jul. 31, 2018.
(Continued)

*Primary Examiner* — Sonya McCall-Shepard
(74) *Attorney, Agent, or Firm* — Greenblum & Bernstein, P.L.C.

(57) ABSTRACT

An epitaxial wafer that includes a silicon wafer and an epitaxial layer on the silicon wafer. The silicon wafer contains hydrogen that has a concentration profile including a first peak and a second peak. A hydrogen peak concentration of the first peak and a hydrogen peak concentration of the second peak are each not less than $1\times10^{17}$ atoms/cm$^3$.

10 Claims, 9 Drawing Sheets

(51) Int. Cl.
*H01L 21/205* (2006.01)
*H01L 21/30* (2006.01)
*H01L 21/322* (2006.01)
*H01L 21/324* (2006.01)
*H01L 27/146* (2006.01)
*H01L 29/04* (2006.01)
*H01L 21/02* (2006.01)

(52) U.S. Cl.
CPC .... *H01L 21/26566* (2013.01); *H01L 21/3003* (2013.01); *H01L 21/324* (2013.01); *H01L 21/3223* (2013.01); *H01L 27/14687* (2013.01); *H01L 29/04* (2013.01)

(58) Field of Classification Search
CPC ......... H01L 21/02104; H01L 21/02365; H01L 21/02367; H01L 21/02433; H01L 21/02436; H01L 21/0245; H01L 21/02494; H01L 21/02496–02505; H01L 29/36; H01L 29/365; H01L 21/265; H01L 21/26566; H01L 21/3223; H01L 21/324; H01L 21/0262
See application file for complete search history.

(56) References Cited

U.S. PATENT DOCUMENTS

| | | |
|---|---|---|
| 2014/0080247 A1 | 3/2014 | Kadono et al. |
| 2016/0181312 A1 | 6/2016 | Kadono et al. |
| 2017/0256668 A1 | 9/2017 | Okuyama et al. |

FOREIGN PATENT DOCUMENTS

| | | |
|---|---|---|
| JP | 2016-51729 A | 4/2016 |
| JP | 2017-112181 A | 6/2017 |
| WO | WO 2017/104584 A1 | 6/2017 |

OTHER PUBLICATIONS

Office Action for TW App. No. 107122867, dated Apr. 8, 2019 (w/ translation).
IPRP for PCT/JP2018/022448, dated Jan. 21, 2020 (w/ translation).
Written Opinion for PCT/JP2018/022448, dated Jul. 31, 2018 (w/ translation).
Office Action for KR App. No. 10-2019-7035632, dated Nov. 6, 2020 (w/ translation).
Office Action for DE App. No. 11 2018 003 702.9, dated Jan. 14, 2022 (w/ translation).
Office Action for CN App. No. 201880048554.5, dated Feb. 27, 2023 (w/ translation).

SEMICONDUCTOR EPITAXIAL WAFER AND METHOD OF PRODUCING SEMICONDUCTOR EPITAXIAL WAFER, AND METHOD OF PRODUCING SOLID-STATE IMAGING DEVICE

This application is a Continuation of U.S. application Ser. No. 16/621,912, filed Dec. 12, 2019, which is the U.S. National Stage of PCT/JP2018/022448, filed Jun. 12, 2018, which claims priority to Japanese Application No. 2017-141117, filed Jul. 20, 2017. The disclosure of each of these applications is herein incorporated by reference in its entirety.

TECHNICAL FIELD

This disclosure relates to a semiconductor epitaxial wafer and a method of producing a semiconductor epitaxial wafer, and a method of producing a solid-state imaging device.

BACKGROUND

A semiconductor epitaxial wafer obtained by forming an epitaxial layer on a semiconductor wafer typified by a silicon wafer is used as a device substrate for producing various semiconductor devices, such as a metal-oxide-semiconductor field-effect transistor (MOSFET), a dynamic random access memory (DRAM), a power transistor, and a back-illuminated solid-state imaging device.

For example, a back-illuminated solid-state imaging device can directly take outside light into a sensor to capture a sharper image or video even in a dark place and the like, by arranging a wiring layer and the like below a sensor part. Accordingly, back-illuminated solid-state imaging devices are widely used in digital video cameras and mobile phones such as smartphones in recent years.

With increasing miniaturization and performance improvement of semiconductor devices in recent years, semiconductor epitaxial wafers used as device substrates are desired to have higher quality, in order to improve device characteristics.

To address this demand, we have proposed, in JP 2016-51729 A (PTL 1), a semiconductor epitaxial wafer having a semiconductor wafer and an epitaxial layer formed on a surface of the semiconductor wafer, in which a high hydrogen concentration peak is in a modifying layer in a surface portion of the semiconductor wafer. PTL 1 made it possible to obtain a semiconductor epitaxial wafer in which hydrogen was present at a high concentration in a modifying layer, and the effect of the presence of hydrogen at a high concentration was found as follows.

Specifically, in a semiconductor epitaxial wafer in which an epitaxial layer has been formed, when hydrogen is localized in a modifying layer in a surface portion of a semiconductor wafer to be a base substrate, the crystallinity of the epitaxially layer is totally higher than that of a semiconductor epitaxial wafer without localized hydrogen (at least no hydrogen concentration peak is detected). Further, hydrogen localized in the surface portion of the semiconductor wafer serving as a base substrate of the semiconductor epitaxial wafer maintains high crystallinity even after the semiconductor epitaxial wafer is subjected to heat treatment corresponding to a semiconductor device production process. This is probably because hydrogen passivates defects in the epitaxial layer. Therefore, when such a semiconductor epitaxial wafer in which hydrogen is localized in a modifying layer in a surface portion of a semiconductor wafer to be a base substrate is used in a semiconductor device production process, improvements in the device characteristics can be expected.

CITATION LIST

Patent Literature

PTL 1: JP 2016-051729 A

SUMMARY

Technical Problem

In recent years, there is an increasing demand for semiconductor devices with higher performance, and to address this, semiconductor epitaxial wafers are expected to have even higher quality. The technique described in PTL 1 makes it possible to obtain a semiconductor epitaxial wafer in which hydrogen is present in a modifying layer at a high concentration, and this semiconductor epitaxial wafer allows for good crystallinity of the epitaxial layer. However, there is room for improvement in achieving higher hydrogen concentration.

In view of the above challenges, it could be helpful to provide a semiconductor epitaxial wafer in which the concentration of hydrogen in a modifying layer can be maintained at a high level and the crystallinity of an epitaxial layer is excellent. It could also be helpful to provide a method of producing the semiconductor epitaxial wafer and a method of producing a solid-state imaging device using the semiconductor epitaxial wafer.

Solution to Problem

We diligently studied to solve the above challenges. As a result, for the first time, we succeeded in obtaining a semiconductor epitaxial wafer having a modifying layer with a double peak concentration profile including, in the hydrogen concentration profile in the depth direction from an epitaxial layer surface, a shallower first peak and a deeper second peak. For such a semiconductor epitaxial wafer, we found that the concentration of hydrogen in the modifying layer can be maintained at a high level, and the crystallinity of the epitaxial layer is significantly excellent. This discovery led to the completion of our product and methods. Specifically, we provide the following features.

(1) A semiconductor epitaxial wafer, comprising:
a semiconductor wafer;
a modifying layer formed in a surface portion of the semiconductor wafer, the modifying layer having hydrogen contained as a solid solution in the semiconductor wafer;
an epitaxial layer formed on the modifying layer,
wherein a concentration profile of the hydrogen in the modifying layer in the depth direction from a surface of the epitaxial layer is a double peak concentration profile including a first peak shallower in the depth direction and a second peak deeper in the depth direction,
hydrogen peak concentrations of the first peak and the second peak are both $1.0 \times 10^{17}$ atoms/cm$^3$ or more, and
in the depth direction, both the first peak and the second peak are in a range of 500 nm from an interface between the semiconductor wafer and the epitaxial layer.

(2) The semiconductor epitaxial wafer according to (1) above, wherein the hydrogen peak concentration of the second peak is higher than the hydrogen peak concentration of the first peak.

(3) The semiconductor epitaxial wafer according to (1) or (2) above, wherein a peak to peak distance between the first peak and the second peak in the depth direction is 20 nm or more and 60 nm or less.

(4) The epitaxial wafer according to any one of (1) to (3) above, wherein the hydrogen peak concentration of the second peak is $1.0 \times 10^{18}$ atoms/cm$^3$ or more.

(5) The semiconductor epitaxial wafer according to any one of (1) to (4) above, wherein the semiconductor wafer is a silicon wafer.

(6) A method of producing the semiconductor epitaxial wafer according to (1) above, comprising:

a first step of irradiating a surface of a semiconductor wafer with cluster ions of three or more constituent elements including hydrogen to form a modified layer containing the constituent elements of the cluster ions as a solid solution in a surface portion of the semiconductor wafer; and after the first step, a second step of forming an epitaxial layer on the modifying layer of the semiconductor wafer.

(7) The method of producing the semiconductor epitaxial wafer, according to (6) above, wherein in the first step, a beam current value of the cluster ions is 50 μA or more and 5000 μA or less.

(8) The method of producing the semiconductor epitaxial wafer, according to (6) or (7) above, wherein the constituent elements of the cluster ions further include carbon and oxygen.

(9) The method of producing the semiconductor epitaxial wafer, according to any one of (6) to (8) above, wherein the semiconductor wafer is a silicon wafer.

(10) A method of producing a solid-state imaging device, the method comprising forming a solid-state imaging device on an epitaxial layer of the semiconductor epitaxial wafer according to any one of (1) to (5) above and a semiconductor epitaxial wafer produced by the method of producing the semiconductor epitaxial wafer, according to any one of (6) to (9) above. (Advantageous Effect)

We can provide a semiconductor epitaxial wafer in which the concentration of hydrogen in a modifying layer can be maintained at a high level and the crystallinity of an epitaxial layer is excellent. Further, we can provide a method of producing the semiconductor epitaxial wafer and a method of producing a solid-state imaging device using the semiconductor epitaxial wafer.

DETAILED DESCRIPTION

Figure 1:
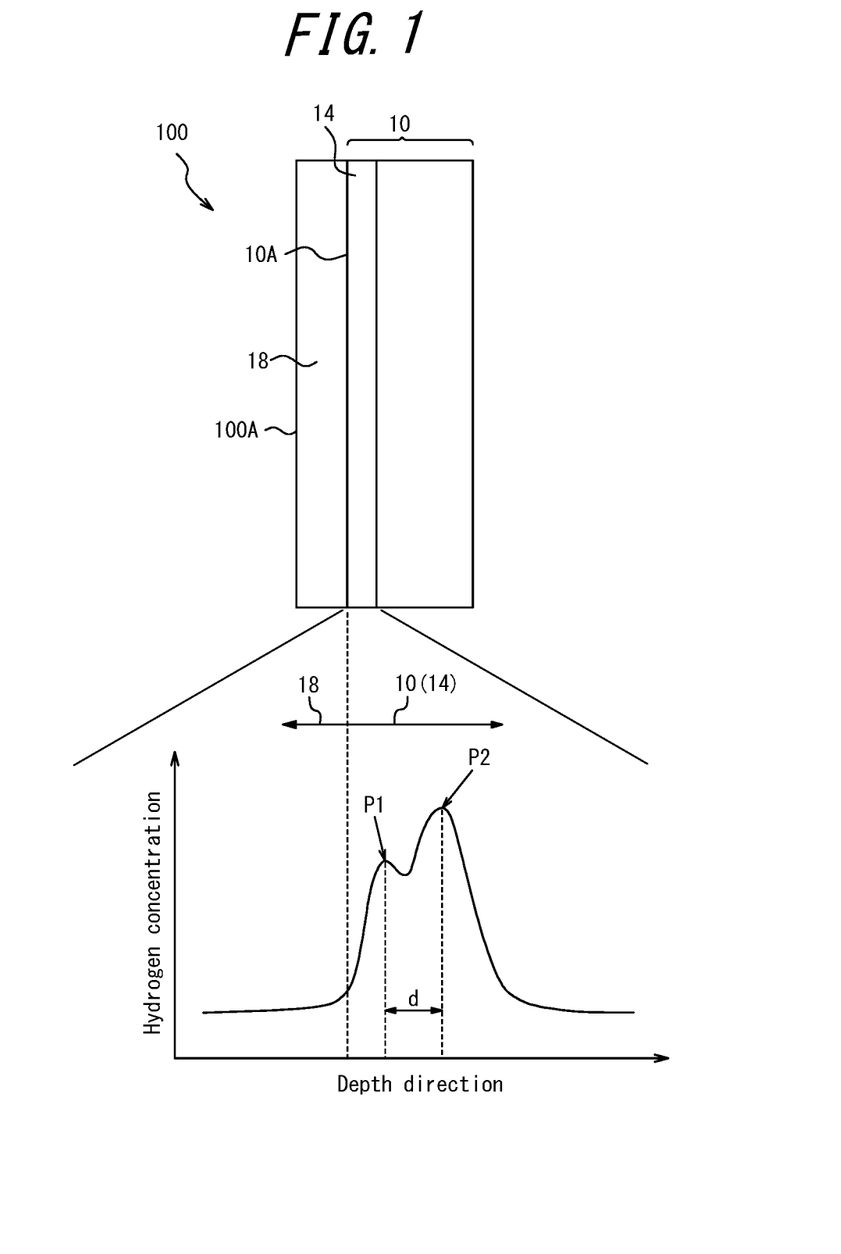
FIG. 1 depicts a schematic cross-sectional view illustrating a semiconductor epitaxial wafer according to one embodiment and a schematic graph of the hydrogen concentration profile in the depth direction.
Figure 2:
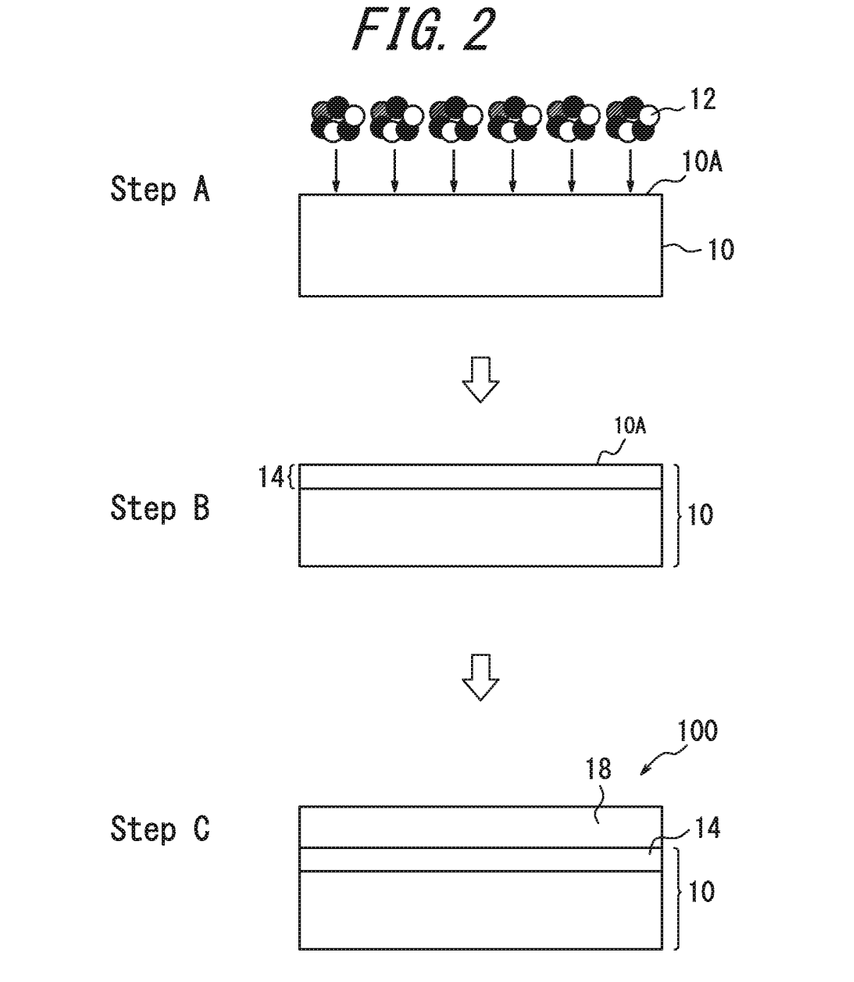
FIG. 2 presents a schematic cross-sectional view illustrating a method of producing a semiconductor epitaxial wafer according to one embodiment.

Embodiments of this disclosure will now be described in detail with reference to the drawings. In principle, like components are denoted by the same reference numerals, and the description will not be repeated. In FIGS. 1 and 2, in order to simplify the drawings, a semiconductor wafer 10, a modifying layer 14, and an epitaxial layer 18 are enlarged in terms of the thickness, so the thickness ratio does not conform to the actual ratio.

(Semiconductor Epitaxial Wafer)

The semiconductor epitaxial wafer 100 of one embodiment has the semiconductor wafer 10, the modifying layer 14 formed in a surface portion of the semiconductor wafer 10, which modifying layer has hydrogen contained as a solid solution in the semiconductor wafer 10, and the epitaxial layer 18 formed on the modifying layer 14, as illustrated in FIG. 1. Here, the hydrogen concentration profile of the vicinity of the interface between the semiconductor wafer 10 and the epitaxial layer 18 (corresponding to a semiconductor wafer surface 10A) in the thickness direction from a surface 100A of the epitaxial layer 18 is also depicted with the schematic graph of FIG. 1. In the semiconductor epitaxial wafer 100 of this embodiment, the concentration profile of hydrogen in the modifying layer 14 in the thickness direction from a surface of the epitaxial layer 18 (corresponding to the surface 100A of the semiconductor epitaxial wafer 100) is a double peak concentration profile including a first peak P1 shallower in the depth direction and a second peak P2 deeper in the depth direction. The hydrogen peak concentrations of both the first peak P1 and the second peak P2 are $1.0 \times 10^{17}$ atoms/cm$^3$ or more, and both the first peak P1 and the second peak P2 are in a range of 500 nm in the depth direction from the interface between the semiconductor wafer 10 and the epitaxial layer 18. The concentration profile of hydrogen in this embodiment is obtained by secondary ion mass spectrometry (SIMS). The features will now be described in detail in succession.

<Semiconductor Wafer>

The semiconductor wafer 10 is, for example, a bulk single crystal wafer that is made of silicon or a compound semiconductor (GaAs, GaN, SiC, etc.) and has no epitaxial layer on its surface. In the case of producing a back-illuminated solid-state imaging device, a bulk single crystal silicon wafer is typically used. For example, as the semiconductor wafer 10, a wafer obtained by slicing, with a wire saw or the like, a single-crystal silicon ingot grown by the Czochralski process (CZ process) or the floating zone melting process (FZ process) may used. Carbon and/or nitrogen may be added to the semiconductor wafer 10 to achieve higher gettering capability. Moreover, a given dopant may be added to the semiconductor wafer 10 at a predetermined concentration to obtain a substrate of so-called n+ type or p+ type, or n− type or p− type.

<Epitaxial Layer>

A silicon epitaxial layer can be given as an example of the epitaxial layer 18, and the silicon epitaxial layer can be formed under typical conditions. For example, a source gas such as dichlorosilane or trichlorosilane can be introduced into a chamber using hydrogen as a carrier gas and the source material can be epitaxially grown on the silicon wafer 10 by CVD at a temperature in the range of approximately 1000° C. to 1200° C., although the growth temperature depends also on the source gas to be used. The epitaxial layer 18 preferably has a thickness in a range of 1 μm to 15 μm. When the thickness is less than 1 μm, the resistivity of the epitaxial layer 18 would change due to out-diffusion of dopants from the semiconductor wafer 10, whereas a thickness exceeding 15 μm would affect the spectral sensitivity characteristics of the solid-state imaging device.

<Modifying Layer>

Here, in the semiconductor epitaxial wafer 100 in this embodiment, the modifying layer 14 in which hydrogen is contained as a solid solution is provided in the surface portion of the semiconductor wafer 10. Note that in this specification, the modifying layer is defined as an area for which hydrogen is detected at a higher concentration than in the background in the hydrogen concentration profile found by SIMS in the depth direction. In the semiconductor epitaxial wafer 100 in this embodiment, the hydrogen concentration profile of the modifying layer 14 in the depth direction from the surface of the epitaxial layer 18 (semiconductor epitaxial wafer surface 100A) is a double peak profile including a first peak P1 shallower in the thickness direction and a second peak P2 deeper in the thickness direction. The hydrogen peak concentrations of both the first peak P1 and the second peak P2 are $1.0 \times 10^{17}$ atoms/cm$^3$ or more, and both the first peak P1 and the second peak P2 are in a range of 500 nm in the depth direction from the interface between the semiconductor wafer 10 and the epitaxial layer 18. The technical meaning of employing such a structure will be described with the operation and effect.

First, for the cases where hydrogen ions are introduced into a semiconductor wafer in the form of monomer ions (monoatomic ions), at present, there is no known semiconductor epitaxial wafer in which any concentration peak of hydrogen is observed in the hydrogen concentration profile in the depth direction when an epitaxial layer is formed after the introduction. Since hydrogen is a lightweight element, hydrogen is diffused outward due to heat caused in the formation of the epitaxial layer, and little hydrogen is left in the semiconductor wafer after the formation of the epitaxial layer. On the other hand, when hydrogen ions are introduced in the form of cluster ions (molecular ions) containing hydrogen as a constituent element, a hydrogen concentration peak is observed even after the formation of an epitaxial layer if certain conditions are met. PTL 1 discloses that the crystallinity of the epitaxial layer of such a semiconductor epitaxial wafer is favorable. However, the hydrogen concentration profile in conventionally known semiconductor epitaxial wafers is a single peak profile.

We conceived of forming the modifying layer 14 by irradiating a surface of the semiconductor wafer 10 with cluster ions containing three or more elements including hydrogen as constituent elements. The experimental facts will be described in detail in Examples. The semiconductor epitaxial wafer 100 in which the epitaxial layer 18 was formed on this modifying layer 14 was then produced. When the hydrogen concentration profile in the depth direction of the semiconductor epitaxial wafer 100 was analyzed by SIMS, it was found that a double peak hydrogen concentration profile was observed in some cases.

We thus evaluated the crystallinity of the epitaxial layer of the semiconductor epitaxial wafer 100 exhibiting such a unique hydrogen concentration profile using cathode luminescence (CL) spectroscopy. As a result, the transverse optical (TO) intensity in the case of the double peak hydrogen concentration profile was experimentally found to be significantly higher than the transverse optical (TO) intensity in the case of the single peak profile. Further, in the semiconductor epitaxial wafer 100 according to this embodiment, it was confirmed that hydrogen was kept at a high concentration in the modifying layer 14 even after heat treatment included in the semiconductor device production process. Note that the CL spectroscopy is a technique of analyzing crystal defects, in which a sample is irradiated with an electron beam to detect excitation light produced during the transition from around the base of the conduction band to around the top of the valance band. Further, the TO intensity refers to a spectrum specific to a Si element corresponding to the band gap of Si observed by CL spectroscopy. Stronger TO intensity means higher crystallinity of Si.

Further, the following facts were revealed in Examples. In an epitaxial silicon wafer of Example 1 in Examples, the activation energy $E_{a1}$ of hydrogen desorption resulting in a first peak P1 of the hydrogen concentration profile was different from the activation energy $E_{a2}$ of hydrogen desorption resulting in a second peak P2. More specifically, the activation energy $E_{a2}$ of hydrogen desorption resulting in the second peak P2 was higher than the activation energy $E_{a1}$ of hydrogen desorption resulting in the first peak P1. This also indicates that in the semiconductor epitaxial wafer 100 exhibiting a double peak hydrogen concentration profile, while the amount of hydrogen by which defects are passivated when the epitaxial layer 18 is formed increases, hydrogen can be continuously supplied for a long time period even during heat treatment performed when the wafer is used in a semiconductor device production process. This results in better crystallinity of the epitaxial layer 18.

As described above, a modifying layer exhibiting a double peak hydrogen concentration profile of this embodiment is provided, thereby obtaining a semiconductor epitaxial wafer in which the concentration of hydrogen in a modifying layer can be maintained at a high level and the crystallinity of an epitaxial layer is excellent.

Further, in terms of ensuring the operation and effect described above, in the hydrogen concentration profile in the depth direction of the semiconductor epitaxial wafer 100 of this embodiment, the hydrogen peak concentration of the second peak P2 is preferably higher than the hydrogen peak concentration of the first peak P1. More specifically, the hydrogen peak concentration of the second peak P2 is preferably 1.2 times or more, more preferably 1.5 times or more higher than the hydrogen peak concentration of the first peak P1.

Moreover, in terms of further ensuring the operation and effect described above, in the hydrogen concentration profile in the depth direction of the semiconductor epitaxial wafer 100 of this embodiment, the peak to peak distance d between the first peak P1 and the second peak P2 is preferably 20 nm or more and 60 nm or less, more preferably 30 nm or more and 50 nm or less.

Furthermore, in terms of further ensuring the operation and effect described above, in the hydrogen concentration profile in the depth direction of the semiconductor epitaxial wafer 100 of this embodiment, the hydrogen peak concentration of the second peak P2 is preferably $1.0 \times 10^{18}$ atoms/cm³ or more, and more preferably, both the hydrogen peak concentration of the first peak P1 and the hydrogen peak concentration of the second peak P2 are $1.0 \times 10^{18}$ atoms/cm³ or more.

As mentioned earlier, when both the first peak P1 and the second peak P2 are in a range of 500 nm in the depth direction from the interface between the semiconductor wafer 10 and the epitaxial layer 18, the above operation and effect can be achieved. In order to further ensuring the operation and effect described above, both the peaks are preferably in a range of 300 nm, more preferably in a range of 150 nm. Since it is physically impossible for any peak of the hydrogen concentration profile to be at the position of the interface, the first peak P1 is at a depth position of at least 5 nm or more from the interface.

Further, the modifying layer 14 may contain elements other than hydrogen as a solid solution. In terms of imparting gettering capability to the semiconductor epitaxial wafer 100, carbon is preferably contained as a solid solution in a surface portion of the semiconductor wafer, more preferably, oxygen is also contained as a solid solution. When carbon and oxygen are contained as a solid solution, the above double peak hydrogen concentration profile can be further ensured.

As the semiconductor wafer 10, an epitaxial wafer in which an epitaxial layer is formed on the surface of a bulk semiconductor wafer may be used. An example is an epitaxial silicon wafer obtained by forming a silicon epitaxial layer on a surface of a bulk silicon wafer. This silicon epitaxial layer may be formed by CVD under typical conditions. The thickness of the epitaxial layer is preferably in a range of 0.1 µm to 20 µm, more preferably in a range of 0.2 µm to 10 µm. In this case, the semiconductor epitaxial wafer 100 has a plurality of epitaxial layers including the epitaxial layer 18 and an epitaxial layer in the semiconductor wafer, not shown.

(Method of Producing Semiconductor Epitaxial Wafer)

Next, an embodiment of a method of producing the semiconductor epitaxial wafer 100 disclosed hereinbefore will be described. A method of producing the semiconductor epitaxial wafer 100 according to one of the disclosed embodiments includes: as illustrated in FIG. 2, a first step of irradiating a surface 10A of the semiconductor wafer 10 with cluster ions 12 of three or more constituent elements including hydrogen (Step A in FIG. 2) to form a modified layer containing the constituent elements of the cluster ions 12 as a solid solution in a surface portion of the semiconductor wafer 10 (Step B in FIG. 2); and after the first step, a second step of forming an epitaxial layer on the modifying layer of the semiconductor wafer (Step C in FIG. 2). The steps will now be described in detail in the order.

First, the semiconductor wafer 10 is prepared. Next, the surface 10A of the semiconductor wafer 10 is irradiated with the cluster ions 12 containing three of more elements including hydrogen as constituent elements. When the constituent elements of the cluster ions are three or more elements, since defects of different activation energies of hydrogen desorption depending on the elements to be introduced are formed, a double peak hydrogen concentration profile will be obtained after the formation of the epitaxial layer 18.

Here, as long as the double peak hydrogen concentration profile can be formed, it is only required that hydrogen is essential as one of the constituent elements of the cluster ions 12. However, in terms of further ensuring a double peak hydrogen concentration profile, carbon and oxygen are more preferably contained as constituent elements of the cluster ions 12 in addition to hydrogen. In terms of further ensuring a double peak hydrogen concentration profile, the constituent elements of the cluster ions 12 preferably consist only of carbon, hydrogen, and oxygen. Carbon introduced in the form of cluster ions form a site where a crystal lattice is compressed, which serve as a gettering site attracting interstitial impurities. Further, introducing oxygen having an atomic weight approximating to and slightly higher than the atomic weight of carbon as one of the constituent elements of the cluster ions 12 conceivably facilitates the formation of a double peak hydrogen concentration profile.

A compound to be ionized to form the cluster ions is not limited, and examples of compounds used that are capable of the ionization include, for example, diethyl ether ($C_4H_{10}O$), ethanol ($C_2H_6O$), and diethyl ketone ($C_5H_{10}O$). Of those, clusters $C_nH_mO_l$ (l, m, n are independent of one other, and $1 \leq n \leq 16$, $1 \leq m \leq 16$, and $1 \leq l \leq 16$ are satisfied) formed from diethyl ether, ethanol, etc. are preferably used. In particular, it is preferred that the number of carbon atoms in the cluster ions is 16 or less and the number of oxygen atoms in the cluster ions is 16 or less. This is because ion beams of small-sized clusters can easily be controlled.

Further, it is not excluded that other constituent elements are contained in the cluster ions 12. As constituent elements of the cluster ions 12 other than those three elements, dopant elements such as boron, phosphorus, and arsenic can be given as examples, and the elements can be selected depending on the intended use. Specifically, applying one or more dopant elements selected from the group consisting of boron, phosphorus, arsenic, and antimony in the form of cluster ions as the constituent elements is also preferred. Since the kinds of impurity metals to be efficiently gettered depend on the kinds of the solid solution elements, a solid solution of multiple kinds of elements can cover a wider variety of metal contaminations. For example, carbon can efficiently getter nickel (Ni), whereas boron can efficiently getter copper (Cu) and iron (Fe). Dopant elements herein refer to electrically active elements that occupy the silicon crystal lattice sites to change the electrical conductivity of the silicon crystal. Specific examples include boron as a p-type dopant and phosphorus, arsenic, and antimony as n-type dopants.

The cluster size may be set as appropriate to 2 to 100, and is preferably to 60 or less, more preferably to 50 or less. The cluster size can be adjusted by controlling the pressure of gas ejected from a nozzle, the pressure of a vacuum vessel, the voltage applied to the filament used in the ionization, and the like. The cluster size can be determined by finding the cluster number distribution by mass spectrometry using a high-frequency quadrupole field or by time-of-flight mass spectrometry, and finding the mean value of the number of clusters.

The acceleration voltage of the cluster ions, together with the cluster size, influences the peak position of the concentration profile of the constituent elements of the cluster ions in the depth direction. In this embodiment, the acceleration voltage of the cluster ions may be more than 0 keV/Cluster and less than 200 keV/Cluster, preferably 100 keV/Cluster or less, further preferably 80 keV/Cluster or less. To adjust the acceleration voltage, two methods: (1) electrostatic acceleration and (2) high-frequency acceleration are typically used. Examples of the former method include a method in which a plurality of electrodes are arranged at regular intervals, and the same voltage is applied between the electrodes, thereby forming a constant acceleration field in the axial direction. Examples of the latter method include a linear acceleration (linac) method in which ions are transferred in a straight line and accelerated by high-frequency waves.

The dose of the cluster ions can be adjusted by controlling the ion irradiation time. The dose of each element included in the cluster ions depends on the cluster ion species and the dose of the cluster ions (Cluster/cm$^2$). In this embodiment, the dose of hydrogen is preferably set to $1 \times 10^{13}$ atoms/cm$^2$ to $1 \times 10^{16}$ atoms/cm$^2$, more preferably $5 \times 10^{13}$ atoms/cm$^2$ or more so that hydrogen is left at a high concentration even after the second step. When the hydrogen dose is less than $1 \times 10^{13}$ atoms/cm$^2$, hydrogen would diffuse during the formation of the epitaxial layer, whereas a dose exceeding $1 \times 10^{16}$ atoms/cm$^2$ would cause great damage to the surface of the epitaxial layer 18.

When the constituent elements of the cluster ions consist of carbon, hydrogen, and oxygen, the doses of hydrogen and oxygen depend on the dose of carbon. In the case of applying such cluster ions, the dose of carbon is preferably $1 \times 10^{13}$ atoms/cm$^2$ to $1 \times 10^{17}$ atoms/cm$^2$, more preferably $5 \times 10^{13}$ atoms/cm$^2$ or more and $5 \times 10^{16}$ atoms/cm$^2$ or less. When the carbon dose is less than $1 \times 10^{13}$ atoms/cm$^2$, sufficient gettering capability would not be obtained, whereas when the carbon dose exceeds $1 \times 10^{16}$ atoms/cm$^2$, the surface 10A of the semiconductor wafer 10 would be greatly damaged and many defects would be formed in the surface of the epitaxial layer 18 after the second step.

Here, as described above, since hydrogen is a lightweight element, hydrogen ions easily diffuse for example due to heat treatment for forming the epitaxial layer 18 and tend to hardly remain in the semiconductor wafer after the formation of the epitaxial layer. Accordingly, in addition to obtaining a region where hydrogen is locally formed at a high concentration by cluster ion irradiation, it is preferred to irradiate the surface 10A of the semiconductor wafer 10 with hydrogen ions for a relatively short time to increase damage to the surface portion with the beam current value of the cluster ions 12 being set to 50 μA or more. A beam current value of 50 μA or more can increase damage, which allows hydrogen to be left at a high concentration in the surface portion of the semiconductor wafer 10 on the epitaxial layer 18 side even after the subsequent formation of the epitaxial layer 18. To this end, the beam current value of the cluster ions 12 is preferably 100 μA or more, more preferably 300 μA or more. If the beam current value is excessively high, epitaxial defects would be excessively formed in the epitaxial layer 18. Therefore, the beam current value is preferably 5000 μA or less. The beam current value of the cluster ions 12 can be adjusted, for example, by changing the conditions for the decomposition of the source gas in the ion source.

After the above first step, the second step of forming the epitaxial layer 18 on the surface 10A of the semiconductor wafer 10 is performed. The epitaxial layer 18 in the second step is as described above.

Thus, the semiconductor epitaxial wafer 100 can be produced.

Here, even if the first step described above is performed, a double peak hydrogen concentration profile may not be formed in some cases depending on the epitaxial growth conditions in the second step. Without intention to limit the invention, in cases of long exposure to a hydrogen atmosphere in an epitaxial growth reactor, for example when the epitaxial layer 18 is formed to a thickness of 7 μm or more, there is a tendency that a double peak hydrogen concentration profile is not formed.

In such a case, when a post annealing step is further performed after the second step, a double peak hydrogen concentration profile can be formed more reliably. When a post annealing step is performed, a difference in the hydrogen desorption behavior appears significantly. In the post annealing step, heat treatment is preferably performed at 650° C. to 800° C. for 5 min or more and 30 min or less in an inert gas atmosphere such as a nitrogen atmosphere.

After the first step and before the second step, it is also preferred to perform recovery heat treatment for recovering crystallinity on the semiconductor wafer 10. Recovery heat treatment here may be performed, for example, by keeping the semiconductor wafer 10 in an atmosphere of nitrogen gas, argon gas, or the like at a temperature of 900° C. or more and 1100° C. or less for 10 min or more and 60 minutes or less. Alternatively, the recovery heat treatment may be performed using for example a rapid heating/cooling apparatus for rapid thermal annealing (RTA), rapid thermal oxidation (RTO), or the like, separate from the epitaxial apparatus.

The semiconductor wafer 10 may be a silicon wafer as described above.

Previously, one embodiment of a method of producing the semiconductor epitaxial wafer 100 exhibiting a double peak hydrogen concentration profile by applying cluster ions containing three or more constituent elements including hydrogen has been described. However, the disclosed semiconductor epitaxial wafer 100 may of course be produced by other production methods.

(Method of Producing Solid-State Imaging Device)

A method of producing a solid-state imaging device according to one of the disclosed embodiments includes forming a solid-state imaging device on the semiconductor epitaxial wafer described above or the semiconductor epitaxial wafer by the above-described method of producing a semiconductor epitaxial wafer, i.e., on the epitaxial layer 18 located on a surface of the semiconductor epitaxial wafer 100. In a solid-state imaging device obtained by this production method, the formation of white spot defects can be sufficiently suppressed as compared with solid-state imaging devices obtained by conventional methods.

EXAMPLES

The disclosed method of producing a semiconductor epitaxial wafer will be described in more detail below using examples. However, this disclosure is not limited to the following examples in any way.

Experimental Example 1

Example 1

An n-type silicon wafer (diameter: 300 mm, thickness: 775 μm, dopant: phosphorus, resistivity: 20 Ω·cm) obtained from a CZ single crystal was prepared. Subsequently, a surface of the silicon wafer was irradiated with $CH_3O$ cluster ions obtained by making diethyl ether ($C_4H_{10}O$) into cluster ions using a cluster ion generator (CLARIS produced by Nissin Ion Equipment Co., Ltd.) under irradiation conditions of acceleration voltage: 80 keV/Cluster (acceleration voltage per hydrogen atom: 2.58 keV/atom, acceleration voltage per carbon atom: 30.1 keV/atom, acceleration voltage per oxygen atom: 41.3 keV/atom, travel distance of hydrogen: 60 nm, travel distance of carbon: 120 nm, travel distance of oxygen: 125 nm). The dose for the irradiation with the cluster ions was set to $1.0\times10^{15}$ cluster/cm². This is $3.0\times10^{15}$ atoms/cm² in terms of the number of hydrogen atoms, $1.0\times10^{15}$ atoms/cm² in terms of the number of carbon atoms, and $1.0\times10^{15}$ atoms/cm² in terms of the number of oxygen atoms. The beam current value of the cluster ions was set to 550 µA.

Subsequently, the silicon wafer having been irradiated with the cluster ions was transferred into a single wafer processing epitaxial growth apparatus (produced by Applied Materials, Inc.) and was subjected to hydrogen baking at 1120° C. for 30 s in the apparatus. After that, a silicon epitaxial layer (thickness: 5.0 µm, kind of dopant: phosphorus, resistivity: 10 Ω·cm) was then epitaxially grown on a surface of the silicon wafer, on which a modification layer was formed, by CVD at 1120° C. using hydrogen as a carrier gas and trichlorosilane as a source gas, thereby fabricating an epitaxial silicon wafer of Example 1.

Comparative Example 1

Cluster ion irradiation was performed and a silicon epitaxial layer was formed under the same conditions as in Example 1 except that a surface of a silicon wafer was irradiated with $C_3H_5$ cluster ions obtained by making cyclohexane ($C_6H_{12}$) into cluster ions instead of irradiation with $CH_3O$ made into cluster ions under irradiation conditions of acceleration voltage: 80 keV/Cluster (acceleration voltage per hydrogen atom: 1.95 keV/atom, acceleration voltage per carbon atom: 23.4 keV/atom, travel distance of hydrogen: 40 nm, travel distance of carbon: 80 nm) with the dose of hydrogen being set to the same value as in Example 1 (i.e., carbon dose: $1.0\times10^{15}$ atoms/cm², thus hydrogen dose: $1.7\times10^{15}$ atoms/cm²), thereby fabricating an epitaxial silicon wafer of Comparative Example 1. The acceleration voltage per hydrogen atom was 2.96 keV/atom, the acceleration voltage per carbon atom was 35.6 keV/atom, the hydrogen travel distance was 60 nm, the carbon travel distance was 120 nm, and the beam current value was 550 µA as in Example 1.

Comparative Example 2

A silicon epitaxial layer was formed under the same conditions as in Example 1 and Comparative Example 1 except that cluster ion irradiation was not performed, thus an epitaxial silicon wafer of Comparative Example 2 was formed.

Evaluation 1: Hydrogen Concentration Profile Evaluation by Quadrupole SIMS

Figure 3:
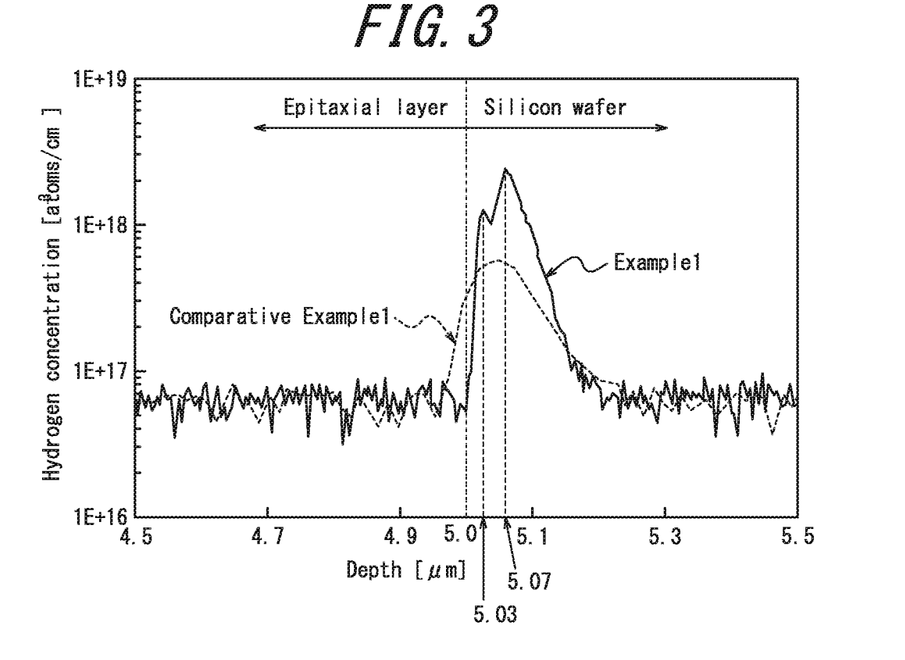
FIG. 3 is a graph illustrating the hydrogen concentration profiles of epitaxial silicon wafers in Example 1 and Comparative Example 1.

The epitaxial silicon wafers of Example 1 and Comparative Example 1 were subjected to measurements using magnetic SIMS, thereby finding the hydrogen concentration profile in the depth direction of each silicon epitaxial layer surface. The results are illustrated in FIG. 3. Further, the hydrogen concentration profile in Comparative Example 1 is illustrated in FIG. 3. In FIG. 3, the silicon epitaxial layer surface of the epitaxial silicon wafer is defined as 0 in the depth of the horizontal axis. Depths of up to 5 µm correspond to the silicon epitaxial layer (abbreviated as Epitaxial layer in the graph), and depths of 5 µm or more correspond to the silicon wafer.

FIG. 3 shows that a double peak hydrogen concentration profile was formed in Example 1 in which irradiation with cluster ions containing three elements of carbon, hydrogen, and oxygen as constituent elements was performed. On the other hand, it was confirmed that a single peak hydrogen concentration profile was formed in Comparative Example 1 in which irradiation with cluster ions containing two elements of carbon and hydrogen as constituent elements was performed. In the hydrogen concentration profile in FIG. 3, the depth position of a first peak that was shallower in the depth direction was 5.03 µm (30 nm from the interface), and the depth position of a second peak that was deeper was 5.07 µm (70 nm from the interface). Accordingly, the peak to peak distance d was 40 nm. Further, the hydrogen concentration of the first peak and the hydrogen concentration of the second peak were both $1.0\times10^{18}$ atoms/cm³.

Evaluation 2: TO Intensity Evaluation by CL Spectroscopy

The epitaxial silicon wafers of Example 1, and Comparative Examples 1 and 2 were subjected to heat treatment at a temperature of 1100° C. for 30 min, simulating a semiconductor device production process. Subsequently, samples obtained by beveling each epitaxial silicon wafer by polishing were subjected to CL spectroscopy from the cross-sectional direction, thereby obtaining the CL spectrum of each silicon epitaxial layer in the depth direction. For measurement conditions, irradiation with an electron beam was performed at 20 keV at 33 K. The results are illustrated in FIG. 4.

Figure 4:
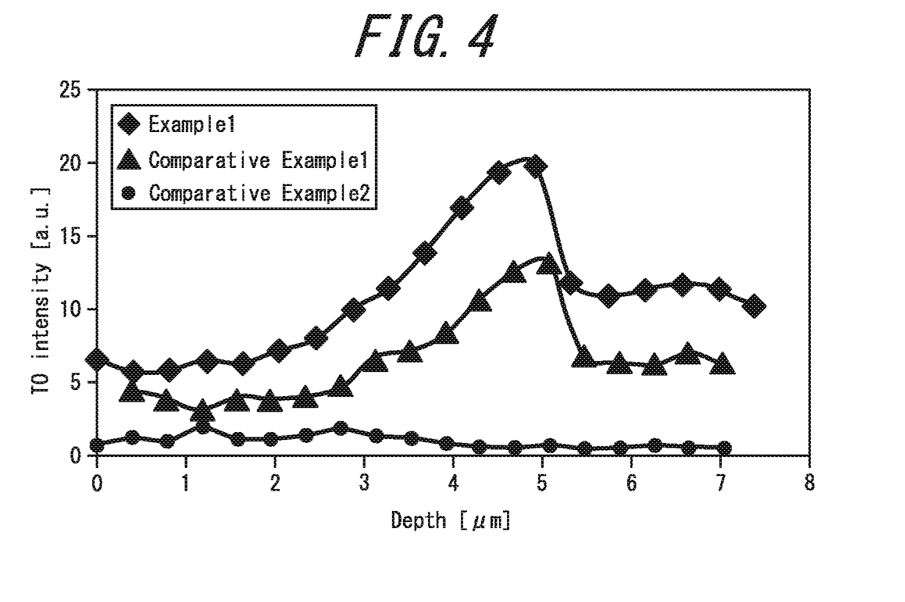
FIG. 4 is a graph illustrating the TO intensities of epitaxial silicon wafers in Example 1 and Comparative Examples 1 and 2.

In FIG. 4, a TO intensity peak is observed in the vicinity of the hydrogen concentration peak position in both Example 1 and Comparative Example 1. This is probably due to excellent crystallinity in the vicinity of the hydrogen concentration peak by virtue of the passivation effects of hydrogen. Comparison of Example 1, and Comparative Examples 1 and 2 indicates that the TO intensity was highest in Example 1. Accordingly, the crystallinity of the epitaxial silicon wafer according to Example 1 was highest. In the light of the hydrogen concentration profile by SIMS in FIG. 3, the retention of hydrogen at a high concentration in a modifying layer of the epitaxial silicon wafer according to Example 1 suggests that hydrogen exhibited passivation effects.

Experimental Example 2

In order to investigate the relationship between the double peak hydrogen concentration profile observed in Example 1 and the reason for which a silicon epitaxial layer having excellent crystallinity is obtained in this case, in more detail, the following experiments were performed.

Evaluation 3: Observation Using Cross-Sectional TEM Micrograph

Figure 5A:
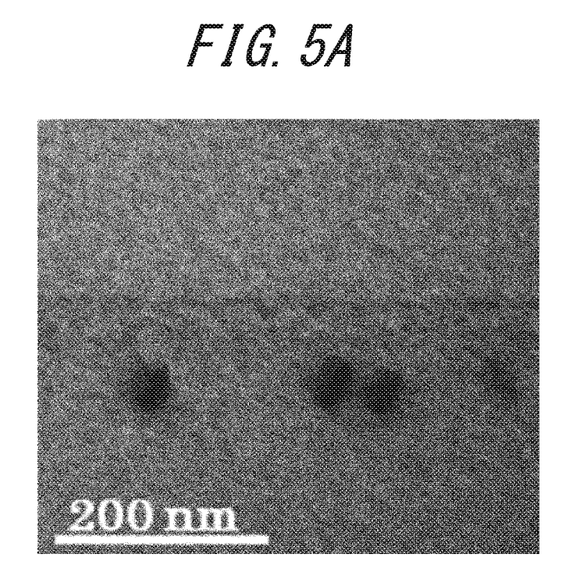
FIG. 5A is a TEM cross-sectional view of the vicinity of the interface between a silicon wafer and a silicon epitaxial layer in the epitaxial silicon wafer of Example 1.

First, for each of the epitaxial silicon wafers according to Example 1 and Comparative Example 1, a cross section around the modifying layer was observed using a transmission electron microscope (TEM). FIG. 5A presents a TEM cross-sectional view of Example 1, and FIG. 5B presents a TEM cross-sectional view of Comparative Example 1.

Figure 5B:
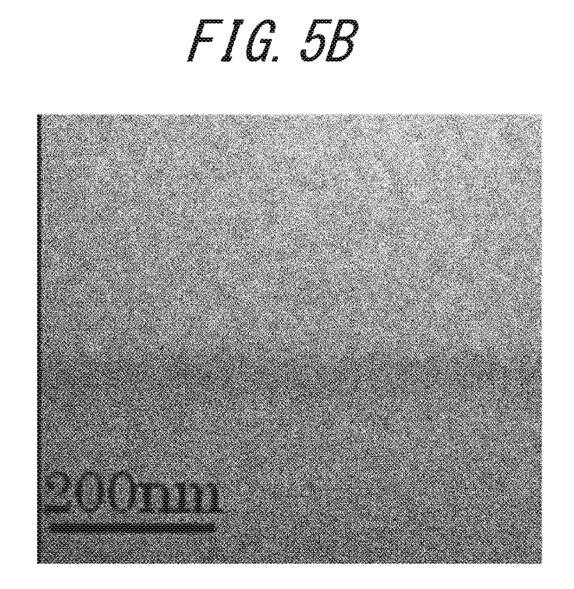
FIG. 5B is a TEM cross-sectional view of the vicinity of the interface between a silicon wafer and a silicon epitaxial layer in the epitaxial silicon wafer of Comparative Example 1.

Comparison of FIG. 5A and FIG. 5B shows that two kinds of black point defects of different size and depth position were formed in the modifying layer in Example 1 in which the constituent elements of the cluster ions were carbon, hydrogen, and oxygen. Of these two kinds of defects, elliptical defects with a major axis of around 20 nm to 70 nm observed on the deeper side were apparently different from the defects observed in FIG. 5B.

The constituent elements of the cluster ions ($C_3H_5$) in Comparative Example 1 were carbon and hydrogen, whereas the constituent elements of the cluster ions ($CH_3O$) in Example 1 further included oxygen. Considering the size and depth position of the defects observed in FIG. 5A and FIG. 5B, non-conventional defects of a new type were formed due to the difference of the constituent elements of the cluster ions in Example 1, and such defect formation provably contributed to the formation of the double peak hydrogen concentration profile.

Evaluation 4: Evaluation of Activation Energy of Hydrogen Desorption

To examine the difference in the hydrogen diffusion behavior between Example 1 and Comparative Example 1, the following experiments were performed.

Evaluation 4-1: Example 1

Figure 6:
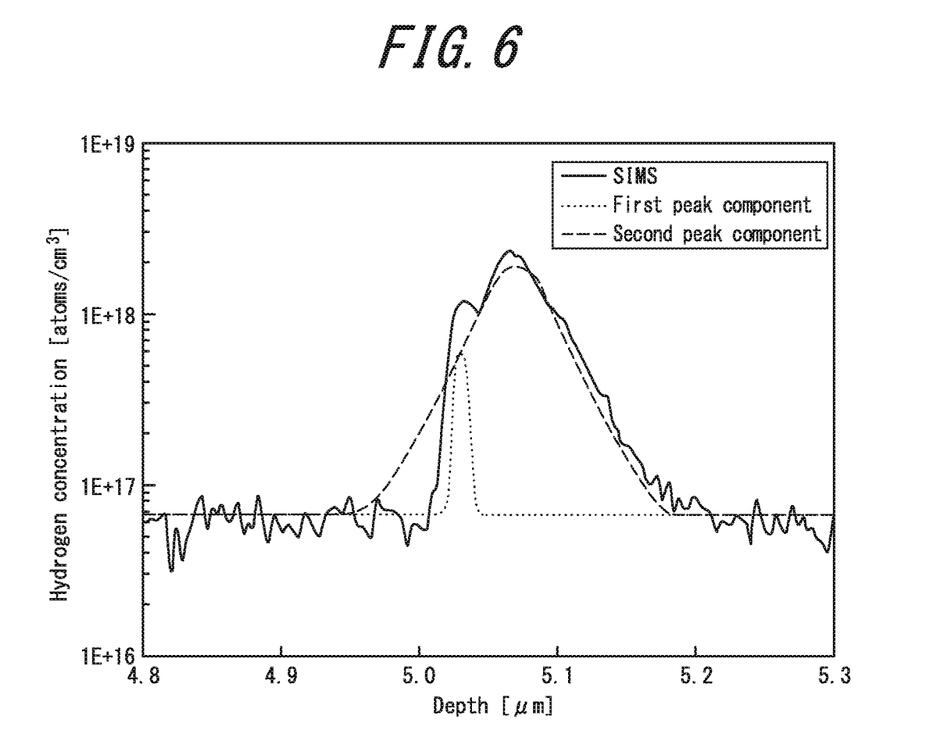
FIG. 6 is a graph depicting the hydrogen concentration profile of the epitaxial silicon wafer in Example 1, having been subjected to peak separation.

First, as depicted in FIG. 6, the hydrogen concentration profile of Example 1 analyzed in Evaluation 1 above was assumed to be the total of the peak components of two Gaussian distributions. This hydrogen concentration profile was subjected to peak separation into a first peak component (dotted line) in a Gaussian distribution centered at a depth portion of 5.03 μm and a second peak component (broken line) in a Gaussian distribution centered at 5.07 μm by data fitting.

Figure 7A:
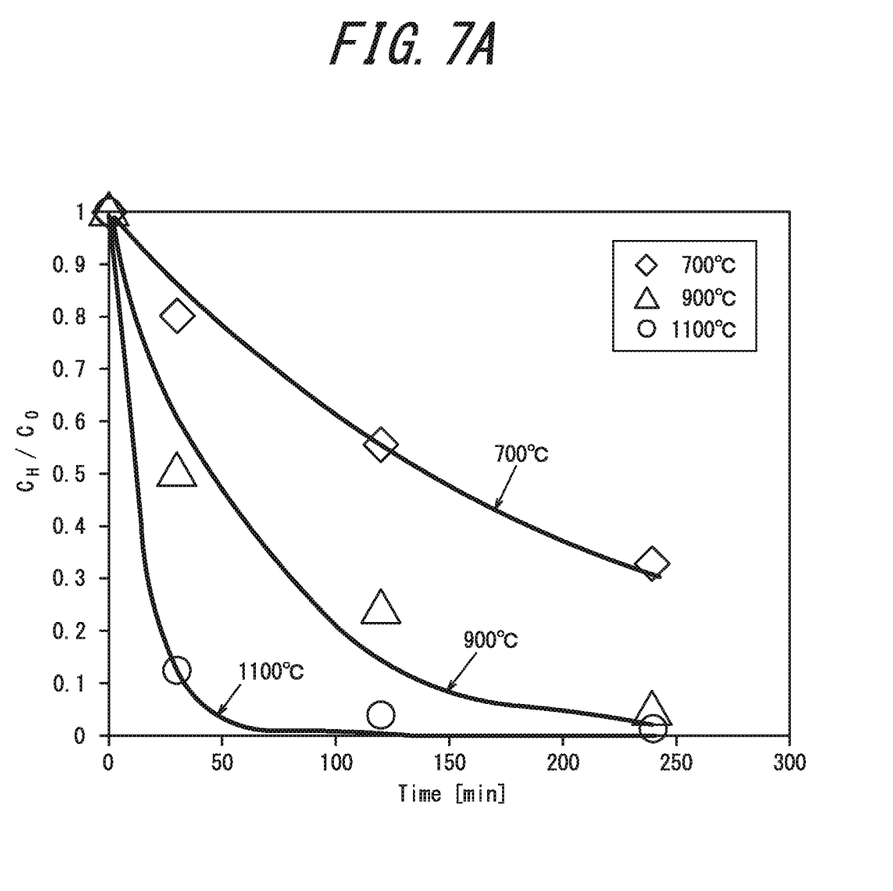
FIG. 7A is a graph depicting a reduction in the concentration of the first peak when the epitaxial silicon wafer of Example 1 was subjected to heat treatment.
Figure 7B:
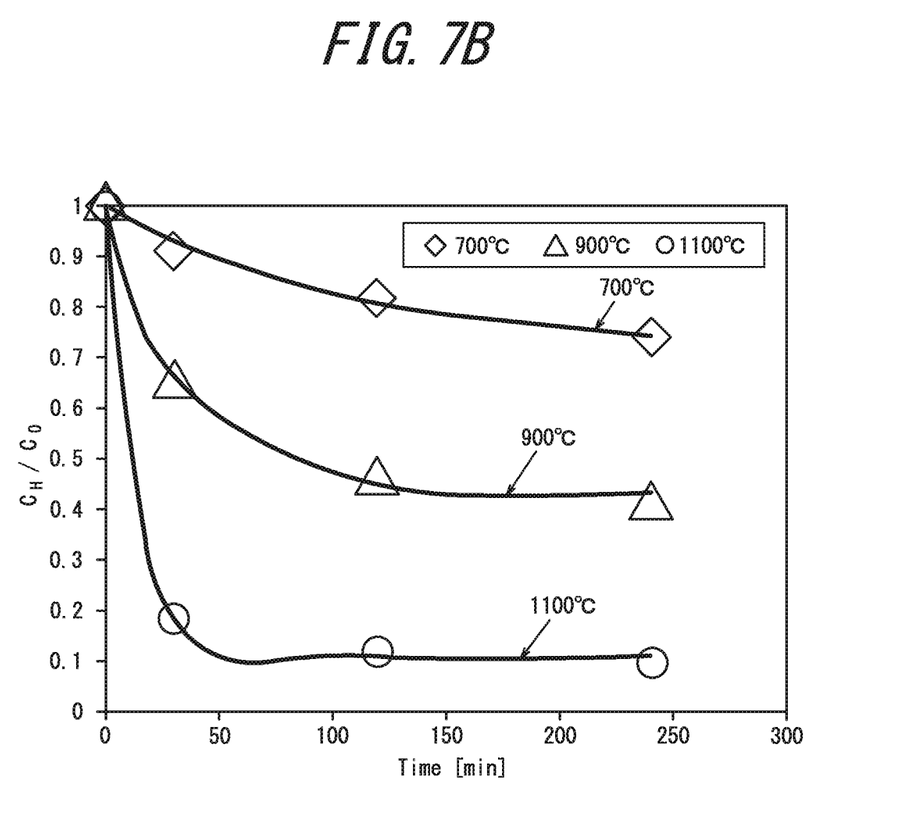
FIG. 7B is a graph depicting a reduction in the concentration of the second peak when the epitaxial silicon wafer of Example 1 was subjected to heat treatment.

The sample of Example 1 was subjected to heat treatment at 700° C. in a nitrogen atmosphere, and the hydrogen concentration profiles after heat treatments for a time period of 30 min, 120 min, and 240 min were obtained by SIMS. Further, peak separation into the first peak component and the second peak component described above was performed, and the rate of reduction in the peak concentration of each component after heat treatment was determined. The results for the first peak component are depicted in FIG. 7A, and the results for the second peak component are depicted in FIG. 7B. As the rate of reduction in the peak concentration of each peak component, a ratio ($C_H/C_0$) of the hydrogen concentration heat treatment ($C_0$) with respect to the hydrogen concentration after heat treatment ($C_H$) was used. This also applies to FIG. 8A and FIG. 8B.

For the sample of Example 1, the rates of reduction in the peak concentration of each component in the cases where the heat treatment temperature were changed to 900° C. and 1100° C. was determined. The results for the first peak component are depicted in FIG. 7A, and the results for the second peak component are depicted in FIG. 7B. These results indicate that the reaction rate of hydrogen desorption was lower in the second peak component than in the first peak component.

In order to determine the activation energy of hydrogen desorption, the following reaction model was developed. First, a reaction rate equation (1) was derived for the first peak component in which only hydrogen desorption would occur.

$$\frac{d[H_D]}{dt} = -k_0[H_D] \quad (1)$$

In the equation (1) above, $[H_D]$ represents the hydrogen concentration of hydrogen desorbed and diffused from the modifying layer, and $k_0$ represents the rate constant of hydrogen desorption in the first peak component. Here, t means the time period.

Further, a reaction rate equation (2) was derived for the second peak component in which hydrogen desorption and hydrogen absorption (capture), which is the opposite reaction of desorption, would occur.

$$\frac{d[H_A]}{dt} = -k_1[H_A] + k_2[H_D] \quad (2)$$

In the equation (2) above, $[H_A]$ represents the hydrogen concentration of hydrogen absorbed in the modifying layer, $[H_D]$ represents the hydrogen concentration of hydrogen desorbed and diffused from the modifying layer, $k_1$ represents the rate constant of hydrogen desorption in the second peak component, and $k_2$ represents the rate constant of hydrogen absorption in the second peak component. Here, t means the time period.

In the equation (2) above, $[H_D]=C_0$ and $[H_A]=0$ hold under an initial condition (t=0), and assuming that $[H_D]=C_H$ holds after heat treatment, the ratio of $C_0$ with respect to $C_H$ is given as an equation (3) below.

$$\frac{C_H}{C_0} = \frac{k_2 + k_1\exp[-(k_1+k_2)t]}{k_1+k_2} \quad (3)$$

Figure 8A:
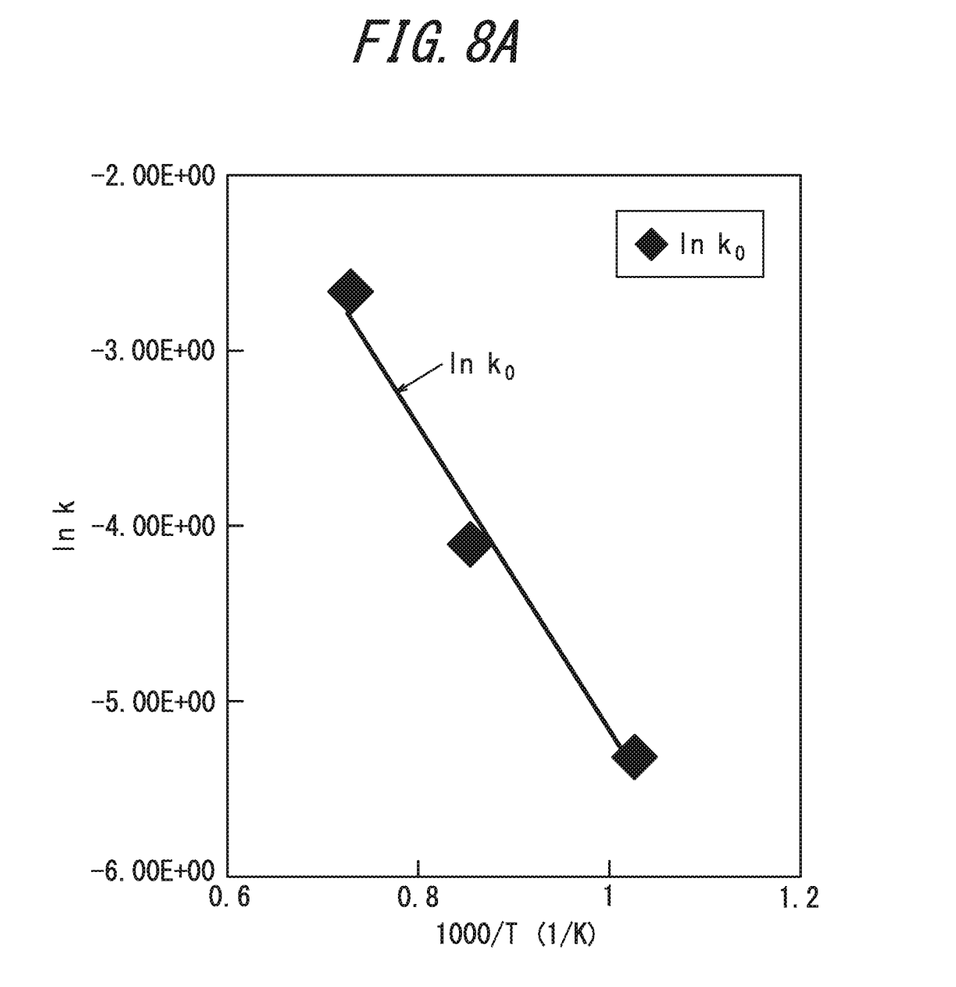
FIG. 8A is a graph representing an Arrhenius plot of the first peak component of the epitaxial silicon wafer of Example 1.
Figure 8B:
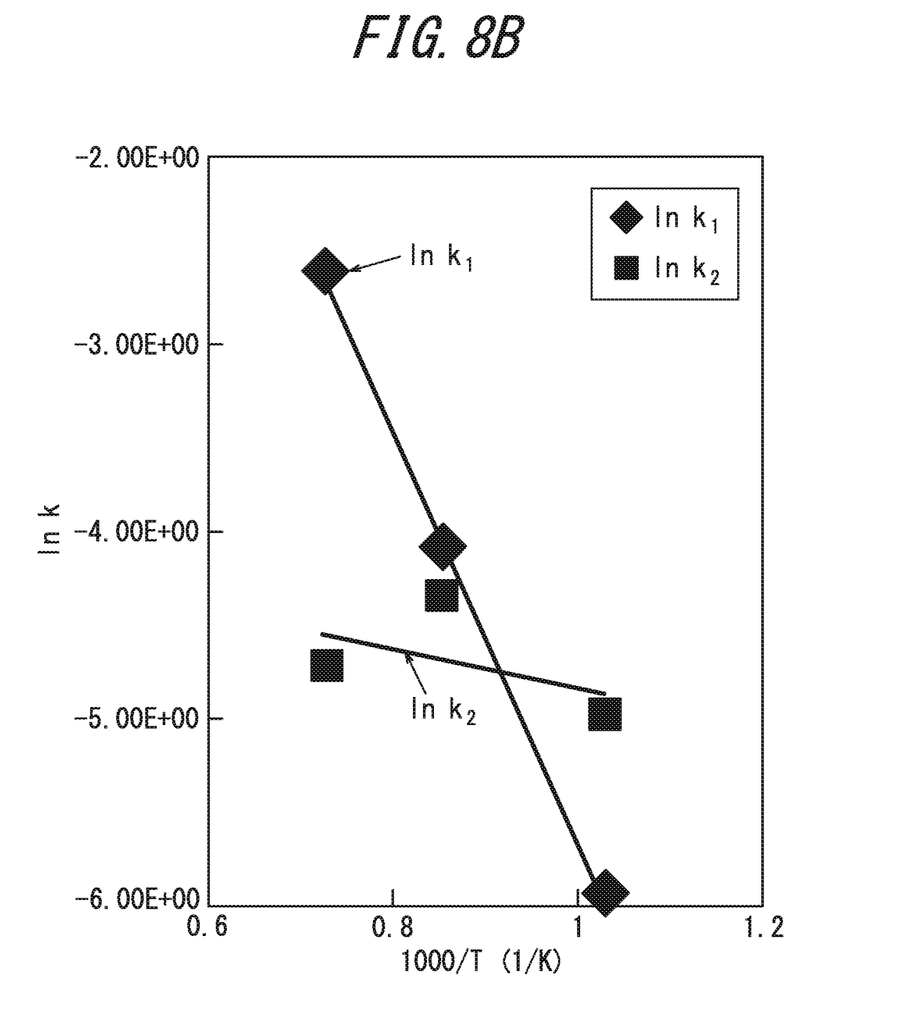
FIG. 8B is a graph representing an Arrhenius plot of the second peak component of the epitaxial silicon wafer of Example 1.

From the results found in FIG. 7A and FIG. 7B, Arrhenius plots were constructed based on the Arrhenius equation ($k=\exp(-E_a/k_BT)$, where k is the reaction rate constant, $E_a$ is the activation energy, $k_B$ is the Boltzmann constant, and T is the heat treatment temperature). The results are depicted in FIG. 8A and FIG. 8B. As a result of data fitting, the activation energy of hydrogen desorption in the first peak component was 0.758 eV. Further, the activation energy of hydrogen desorption of the second peak component was 0.946 eV, and the activation energy of hydrogen absorption in the second peak component was 0.093 eV.

Evaluation 4-2: Comparative Example 1

For Comparative Example 1, heat treatment was performed in the same manner as in Evaluation 4-1, and the activation energy of hydrogen desorption was determined from an Arrhenius plot. Since a single peak hydrogen concentration profile was observed in Comparative Example 1, only hydrogen desorption was assumed to occur as in the first peak component. As a result of data fitting, the activation energy of hydrogen desorption was 0.76 eV.

The results of Evaluation 4-1 and Evaluation 4-2 conclude that the first peak component formed in Example 1 was of the same type as the peak component of the hydrogen concentration profile formed in Comparative Example 1. On the other hand, since the activation energy of hydrogen desorption in the second peak component formed in Example 1 was higher than that of the first peak, a different behavior was observed. Because of such a difference in the activation energy, the epitaxial silicon wafer of Example 1 is more likely to hold hydrogen even after being subjected to heat treatment at a high temperature and gradually releases hydrogen, compared with Comparative Example 1. Accordingly, the passivation effects of hydrogen are expected to be kept in Example 1. Further, the significant TO intensity improving effect depicted in FIG. 4 described above may also be caused by such a difference in the activation energy.

INDUSTRIAL APPLICABILITY

We provide a semiconductor epitaxial wafer in which the concentration of hydrogen in a modifying layer can be maintained at a high level and the crystallinity of an epitaxial layer is excellent. Further, we provide a method of producing the semiconductor epitaxial wafer and a method of producing a solid-state imaging device using the semiconductor epitaxial wafer.

REFERENCE SIGNS LIST

10: Semiconductor wafer
10A: Semiconductor wafer surface
12: Cluster ion
14: Modifying layer
18: Epitaxial layer
100: Semiconductor epitaxial wafer
100A: Semiconductor epitaxial wafer surface

The invention claimed is:

1. An epitaxial wafer, comprising:
a silicon wafer; and
an epitaxial layer on the silicon wafer;
wherein:
the silicon wafer comprises hydrogen that has a concentration profile including a first peak shallower in a depth direction from a surface of the epitaxial layer and a second peak, a hydrogen peak concentration of the first peak and a hydrogen peak concentration of the second peak are each not less than $1\times10^{17}$ atoms/cm$^3$; and
the hydrogen peak concentration of the second peak is greater than the hydrogen peak concentration of the first peak.

2. The epitaxial wafer of claim 1, further comprising a modifying layer comprising carbon and oxygen.

3. The epitaxial wafer of claim 1, wherein the first peak and the second peak are located within 500 nm in a depth direction of the silicon wafer from a boundary between the epitaxial layer and the silicon wafer.

4. The epitaxial wafer of claim 1, wherein a distance between the first peak and the second peak in a depth direction of the silicon wafer is in a range of 20 nm to 60 nm.

5. The epitaxial wafer of claim 1, wherein the hydrogen peak concentration of the second peak is not less than $1\times10^{18}$ atoms/cm$^3$.

6. An epitaxial wafer, comprising:
a silicon wafer;
an epitaxial layer on the silicon wafer; and
a modifying layer in the silicon wafer, the modifying layer comprising carbon, hydrogen and oxygen;
wherein the hydrogen has a concentration profile including a first peak shallower in a depth direction from a surface of the epitaxial layer and a second peak, a hydrogen peak concentration of the first peak and a hydrogen peak concentration of the second peak are each not less than $1\times10^{17}$ atoms/cm$^3$.

7. The epitaxial wafer of claim 6, wherein the hydrogen peak concentration of the second peak is greater than the hydrogen peak concentration of the first peak.

8. The epitaxial wafer of claim 6, wherein the first peak and the second peak are located within 500 nm in a depth direction of the silicon wafer from a boundary between the epitaxial layer and the silicon wafer.

9. The epitaxial wafer of claim 6, wherein a distance between the first peak and the second peak in a depth direction of the silicon wafer is in a range of 20 nm to 60 nm.

10. The epitaxial wafer of claim 6, wherein the hydrogen peak concentration of the second peak is not less than $1\times10^{18}$ atoms/cm$^3$.

* * * * *